(12) United States Patent
Sugihara et al.

(10) Patent No.: US 9,484,959 B2
(45) Date of Patent: Nov. 1, 2016

(54) ERROR CORRECTION ENCODING METHOD AND ERROR CORRECTION ENCODING DEVICE

(71) Applicant: Mitsubishi Electric Corporation, Chiyoda-ku (JP)

(72) Inventors: Kenya Sugihara, Chiyoda-ku (JP); Wataru Matsumoto, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/400,834

(22) PCT Filed: Oct. 29, 2013

(86) PCT No.: PCT/JP2013/079285
§ 371 (c)(1),
(2) Date: Nov. 13, 2014

(87) PCT Pub. No.: WO2014/069464
PCT Pub. Date: May 8, 2014

(65) Prior Publication Data
US 2015/0188578 A1    Jul. 2, 2015

(30) Foreign Application Priority Data

Nov. 5, 2012   (JP) .................. 2012-243590

(51) Int. Cl.
*H03M 13/00*    (2006.01)
*G06F 11/00*    (2006.01)
*H03M 13/11*    (2006.01)

(52) U.S. Cl.
CPC ......... *H03M 13/616* (2013.01); *H03M 13/116* (2013.01); *H03M 13/118* (2013.01); *H03M 13/1177* (2013.01); *H03M 13/1185* (2013.01); *H03M 13/611* (2013.01)

(58) Field of Classification Search
CPC ......... H03M 13/116; H03M 13/1165; H03M 13/1102; H03M 13/616; H03M 13/1185
See application file for complete search history.

(56) References Cited

U.S. PATENT DOCUMENTS 8,005,302 B2 *   8/2011   Yen ................. G11B 20/00086
                                                                369/47.19
8,443,249 B2 *   5/2013   Li ........................ H03M 13/116
                                                                714/752

(Continued)

FOREIGN PATENT DOCUMENTS

EP      1 626 505 A1      2/2006
JP      2007 503755       2/2007

(Continued)

OTHER PUBLICATIONS

Kaji, Y., "Encoding LDPC codes by Utilising the Triangular Factorization of Binary Matrices", IEICE Technical Report, vol. 104, No. 52, pp. 7-12, (May 12, 2004), with English abstract.

(Continued)

*Primary Examiner* — Shelly A Chase
(74) *Attorney, Agent, or Firm* — Oblon, McClelland, Maier & Neustadt, L.L.P

(57) ABSTRACT

An error correction encoding device 1 includes a sparse matrix computing unit 2 that computes exclusive OR of a submatrix, in a parity-check matrix, corresponding to an information bit sequence, and the information bit sequence on the basis of the position of 1 in the submatrix to calculate a vector, a fundamental matrix operator 3 that calculates a predetermined matrix by performing a predetermined fundamental matrix operation on a submatrix, in the parity-check matrix, corresponding to a parity bit sequence, and a matrix multiplier 4 that calculates the parity bit sequence by multiplying the predetermined matrix which the fundamental matrix operator 3 calculates, and the vector which the sparse matrix computing unit 2 calculates.

7 Claims, 10 Drawing Sheets

(56) References Cited

U.S. PATENT DOCUMENTS

| | | |
|---|---|---|
| 2005/0050435 A1 | 3/2005 | Kyung et al. |
| 2011/0167315 A1 | 7/2011 | Kyung et al. |
| 2011/0214037 A1 | 9/2011 | Okamura et al. |

FOREIGN PATENT DOCUMENTS

| | | |
|---|---|---|
| WO | WO 2004/019268 A1 | 3/2004 |
| WO | 2011 036864 | 3/2011 |

OTHER PUBLICATIONS

Zhang, J. et al., "Encoder Design and Its Hardware Implementation for Q-ary LDPC Codes", Communications, Circuits and Systems, 2008. ICCCAS 2008. International Conference on, pp. 1236-1239, (May 27, 2008).

Wadayama, T., "Low-density parity-check code and decoding method therefor", TRICEPS, pp. 30-33, (Jun. 5, 2002).

Richardson, T. et al. "Efficient Encoding of Low-Density Parity-Check Codes", IEEE Transactions on Information Theory, vol. 47, No. 2, pp. 638-656, (Feb. 2001).

Lin, C. et al., "Efficient Encoding for Dual-Diagonal Structured Ldpc Codes Based on Parity Bit Prediction and Correction", Proc. 2008 IEEE Asia Pacific Conference on Circuits and Systems (APCCAS '08), pp. 1648-1651, (2008).

International Search Report Issued on Nov. 26, 2013 in PCT/JP13/079285 Filed Oct. 29, 2013.

Extended European Search Report issued on Jun. 7, 2016 in Patent Application No. 13851834.5.

Brian Classon, et al., "LDPC coding for OFDMA PHY", IEEE C802.16e-04/278r1, XP-002371218, 2004, pp. 1-17 and Cover Page.

Jeong Ki Kim, et al., "Efficient Encoding Architecture for IEEE 802.16e LDPC Codes", IEICE Trans. Fundamentals, vol. E91-A, No. 12, XP-001519098, 2008, pp. 3607-3611.

* cited by examiner $$d = (d_1, d_2, \ldots, d_k)$$

↓

Calculate $Xd^T$ — ST21

↓

Calculate $SXd^T = u$ — ST22

↓

Calculate $\begin{array}{l} p_1 = u_1 \\ p_i = u_i + \sum_{j=1}^{i} T_i(ij) p_{i-1} \quad (2 \leq i \leq m) \end{array}$ — ST23

↓

$$p = (p_1, p_2, \ldots, p_m)$$

FIG.10

$$H = \begin{pmatrix} X_{11} & X_{12} & \cdots & X_{1K} & Z_1 & I & 0 & 0 & \cdots & 0 \\ X_{21} & X_{22} & & X_{2K} & Z_2 & I & I & 0 & & 0 \\ & & & & Z_3 & 0 & I & I & & 0 \\ \vdots & & \ddots & \vdots & Z_4 & & & I & \ddots & \\ & & & & \vdots & \vdots & & & \ddots & I \\ X_{M1} & X_{M2} & \cdots & X_{MK} & Z_M & 0 & 0 & 0 & 0 & I \end{pmatrix} \begin{array}{l} \text{Addition ((M-1)-th)} \\ \text{Addition ((M-2)-th)} \\ \text{Addition ((M-3)-th)} \\ \vdots \\ \text{Addition (Second)} \\ \text{Addition (First)} \end{array}$$

$$\begin{pmatrix} \sum_{1 \le r \le M} X_{r1} & \sum_{1 \le r \le M} X_{r2} & \cdots & \sum_{1 \le r \le M} X_{rK} & \sum_{1 \le r \le M} Z_r & 0 & 0 & 0 & \cdots & 0 \\ \sum_{2 \le r \le M} X_{r1} & \sum_{2 \le r \le M} X_{r2} & & \sum_{2 \le r \le M} X_{rK} & \sum_{2 \le r \le M} Z_r & I & 0 & 0 & & 0 \\ & & & & \sum_{3 \le r \le M} Z_r & 0 & I & 0 & & 0 \\ \vdots & & \ddots & \vdots & \sum_{4 \le r \le M} Z_r & & & I & & \\ & & & & \vdots & \vdots & & & \ddots & 0 \\ X_{M1} & X_{M2} & \cdots & X_{MK} & Z_M & 0 & 0 & 0 & 0 & I \end{pmatrix}$$

FIG.11

$$H = \begin{pmatrix} \overbrace{\begin{matrix} X_{11} & X_{12} & \cdots & X_{1K} \\ X_{21} & X_{22} & & X_{2K} \\ & & & \\ \vdots & & \ddots & \vdots \\ & & & \\ X_{M1} & X_{M2} & \cdots & X_{MK} \end{matrix}}^{\text{K Blocks}} & \overbrace{\begin{matrix} Z_1 & A_1 & 0 & 0 & \cdots & 0 \\ Z_2 & I & A_2 & 0 & & 0 \\ Z_3 & 0 & I & A_3 & & 0 \\ Z_4 & & & I & \ddots & \\ \vdots & \vdots & & & \ddots & A_{M-1} \\ Z_M & 0 & 0 & 0 & 0 & I \end{matrix}}^{\text{M Blocks}} \end{pmatrix} \Bigg\} \text{M Blocks}$$

ERROR CORRECTION ENCODING METHOD AND ERROR CORRECTION ENCODING DEVICE

FIELD OF THE INVENTION

The present invention relates to an error correction encoding method and an error correction encoding device that perform encoding according to Low-Density Parity-Check codes (referred to as LDPC codes from here on).

BACKGROUND OF THE INVENTION

Error correcting codes are a technique of correcting an error bit which is caused by noise occurring in a communication channel in a communication system. In a communication system using this technique, instead of transmitting information data from a transmitter, just as they are, a process, which is referred to as encoding, is performed on an information bit sequence d (equation 1) to be transmitted to calculate a parity bit sequence p (equation 2), and a codeword c (equation 3) which is a sequence which is a combination of the information bit sequence d and the parity bit sequence p is transmitted.

$$d=(d_1, d_2, \ldots, d_k) \quad (1)$$

$$p=(p_1, p_2, \ldots, p_m) \quad (2)$$

$$c=(d_1, d_2, \ldots, d_k, p_1, p_2, \ldots, p_m) \quad (3)$$

Although the transmission bit rate drops by a value corresponding to the parity bit sequence p, a receiver can correct or detect an error existing in the received data by performing a process, which is referred to as decoding, by using both the information bit sequence d and the parity bit sequence p.

An LDPC code is an error correcting code defined by a sparse parity-check matrix with few non-zero elements, as shown in FIG. 13. It is assumed hereafter that matrix elements include only 0 and 1. The number of columns of the parity-check matrix corresponds to the number n of bits (code length) of the codeword c, and, in many cases, the number of rows is the number m of parity bits. The number k of bits of the information bit sequence d is k=n−m.

As a conventional technique of encoding an LDPC code, a method of using a lower triangular matrix is disclosed in nonpatent reference 1. According to this method of using a lower triangular matrix, a fundamental matrix operation, which will be mentioned below, is performed on a parity-check matrix first, and elements in the upper right of a submatrix with m rows and m columns (referred to as an m×m submatrix from here on) on a right-hand side of the matrix are set to 0 to acquire a lower triangular matrix as shown in FIG. 14. Then, by using this lower triangular matrix, parity bits are calculated by backward substitution, and encoding is performed.

In this case, the fundamental matrix operation includes: (1) interchanging two rows; (2) interchanging two columns; and (3) adding a row j to a row i (i≠j) by using modulo 2 (i.e., calculating exclusive OR).

In the case of the conventional method of using a lower triangular matrix, by performing the fundamental matrix operation on the parity-check matrix, non-zero elements of the matrix increase, and, as a result, even if the parity-check matrix is sparse, the lower triangular matrix is no longer a sparse matrix. Therefore, in the conventional method of using a lower triangular matrix, the amount of computations increases with increase in non-zero elements.

On the other hand, an encoding method which has been known since long ago separately from the method of using a lower triangular matrix is also disclosed is nonpatent reference 1. According to this encoding method, a fundamental matrix operation is further performed on the above-mentioned lower triangular matrix to make a right-hand side of the matrix be a unit matrix, as shown in FIG. 15. When an m×k submatrix on a left-hand side of this matrix is expressed by Q2, by multiplying the information bit sequence d by the matrix Q2 from the left, the parity bit sequence p can be determined. The matrix Q2 (or a transposed matrix of the matrix Q2) at this time is referred to as a generator matrix.

However, the number of is included in the generator matrix Q2 shown in FIG. 15 is equal to or larger than that in a matrix Q1 shown in FIG. 14 in many cases. Therefore, a problem is that the number of times of exclusive OR is large and the amount of computations is large, like in the case of the above-mentioned conventional method of using a lower triangular matrix.

RELATED ART DOCUMENT

Nonpatent Reference

Nonpatent reference 1: "Low-density parity-check code and decoding method therefor" written by Tadashi WADAYAMA, and issued by Triceps on Jun. 5, 2002.

SUMMARY OF THE INVENTION

Problems to be Solved by the Invention

A problem with the conventional encoding method of encoding an LDPC code is that the amount of computations is large because encoding is performed by using a matrix with a large number of non-zero elements. A further problem is that the circuit scale at the time that the encoding method is implemented as a circuit increases because the amount of computations is large.

The present invention is made in order to solve the above-mentioned problems, and it is therefore an object of the present invention to provide a reduction in the amount of computations in the encoding of an LDPC code, and a reduction in the circuit scale at the time that the encoding is implemented as a circuit.

Means for Solving the Problem

In accordance with the present invention, there is provided an error correction encoding method including: a sparse matrix computing step of computing exclusive OR of submatrices, in a parity-check matrix, corresponding to an information bit sequence, and the information bit sequence on the basis of the position of 1 in each of the submatrices to calculate a plurality of vectors; a vector element summing step of acquiring a vector which is the sum of the plurality of vectors acquired in the sparse matrix computing step; a first matrix multiplying step of multiplying an inverse matrix of a matrix which is acquired by summing up a part of submatrices, in the parity-check matrix, corresponding to a parity bit sequence and the sum vector acquired in the vector element summing step to calculate a part of the parity bit sequence; a second matrix multiplying step of multiplying the part of the submatrices which is the target for the summation in the first matrix multiplying step and the part of the parity bit sequence acquired in the first matrix multiplying step to acquire a vector which is a multiplication result; and a parity bit calculating step of calculating a remaining part of the parity bit sequence on the basis of the plurality of vectors acquired in the sparse matrix computing step and the vector which is the multiplication result acquired in the second matrix multiplying step.

In accordance with the present invention, there is provided an error correction encoding method in which an information bit sequence $d_{b,i}$ is a vector consisting of q elements corresponding an i-th block (1≤i≤K) when elements thereof are divided into blocks each having q elements, a parity bit sequence $p_{b,i}$ is a vector consisting of q elements corresponding an i-th block (1≤i≤M) when elements thereof are divided into blocks each having q elements, a parity-check matrix with M rows and N columns consists of submatrices $X_{ij}$ with M rows and K columns (K=N−M) corresponding to the information bit sequence, submatrices $Z_j$ in a first column of M rows and M columns corresponding to the parity bit sequence, and submatrices including unit matrices as diagonal elements of two rows, and each element of the parity bit sequence is calculated according to equations (24), (26), and (27) which will be mentioned below.

In accordance with the present invention, there is provided an error correction encoding device including: a sparse matrix computing unit that computes exclusive OR of submatrices, in a parity-check matrix, corresponding to an information bit sequence, and the information bit sequence on the basis of the position of 1 in each of the submatrices to calculate a plurality of vectors; a vector element summer that acquires a vector which is the sum of the plurality of vectors acquired by the sparse matrix computing unit; a first matrix multiplier that multiplies an inverse matrix of a matrix which is acquired by summing up a part of submatrices, in the parity-check matrix, corresponding to a parity bit sequence and the sum vector acquired by the vector element summer to calculate a part of the parity bit sequence; a second matrix multiplier that multiplies the part of the submatrices which is the target for the summation by the first matrix multiplier and the part of the parity bit sequence acquired by the first matrix multiplier to acquire a vector which is a multiplication result; and a parity bit calculator that calculates a remaining part of the parity bit sequence on the basis of the plurality of vectors acquired by the sparse matrix computing unit and the vector which is the multiplication result acquired by the second matrix multiplier.

Advantages of the Invention

Because the error correction encoding method according to the present invention performs the multiplication of the parity-check matrix and the information bit sequence while dividing the multiplication into plural steps, the size of the matrix which is multiplied by the vector in the matrix multiplying step and is not sparse can be reduced to less than that in the conventional method and many of the computations can be performed by using sparse matrices. Therefore, the amount of computations for the encoding of a QC (Quasi-Cyclic)-LDPC code can be reduced.

Because the error correction encoding method according to the present invention uses the equations (24), (26), and (27), which will be mentioned below, many of the computations can be performed by using sparse matrices, and hence the amount of computations for the encoding of a QC-LDPC code can be reduced.

Because the error correction encoding method according to the present invention performs the multiplication of the parity-check matrix and the information bit sequence while dividing the multiplication into plural steps, the size of the matrix which is multiplied by the vector in the matrix multiplying step and is not sparse can be reduced to less than that in the conventional method and many of the computations can be performed by using sparse matrices. Therefore, the circuit scale of the error correction encoding device for QC-LDPC codes can be reduced.

BRIEF DESCRIPTION OF THE FIGURES

FIG. 10 is a view explaining a fundamental matrix operation on a parity-check matrix shown in FIG. 6;

FIG. 11 is a view showing an example of a QC-LDPC code used in Embodiment 4;

EMBODIMENTS OF THE INVENTION

Hereafter, in order to explain this invention in greater detail, the preferred embodiments of the present invention will be described with reference to the accompanying drawings.

Embodiment 1

Figure 1:
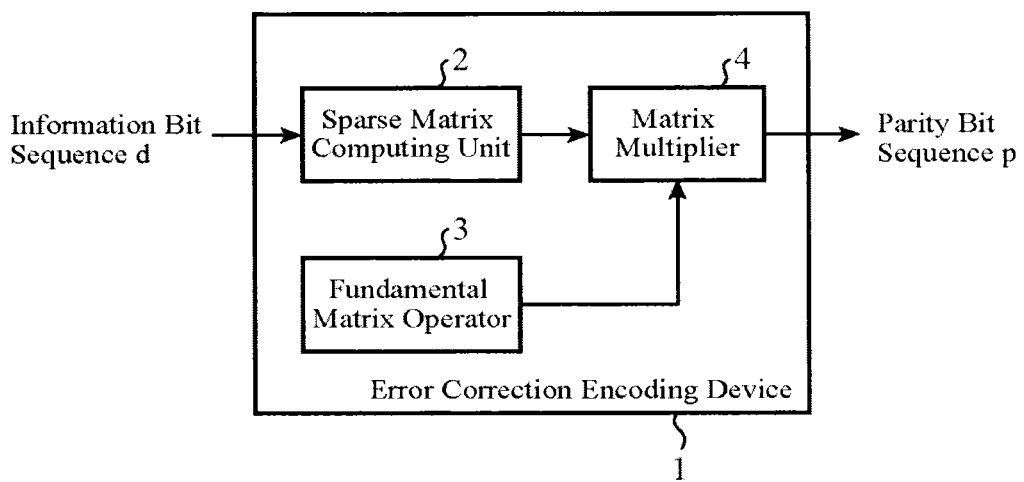
FIG. 1 is a block diagram showing the structure of an error correction encoding device in accordance with Embodiment 1 of the present invention.

An error correction encoding device 1 shown in FIG. 1 is provided with a sparse matrix computing unit 2, a fundamental matrix operator 3, and a matrix multiplier 4. As encoding of an LDPC code, the error correction encoding device receives an information bit sequence d as its input, and calculates a parity bit sequence p which satisfies a condition based on a parity-check matrix H.

There is a relationship, as shown in equation (4), between the parity-check matrix H for LDPC codes and a codeword c.

$$Hc^T = (0, \ldots, 0)^T \qquad (4)$$

Hereafter, it is assumed that an addition of elements (bits) which is performed in a multiplication of the matrix H and the vector c is an addition using modulo 2 (which is the same as exclusive OR). Further, T shows a transposition.

Figure 2:
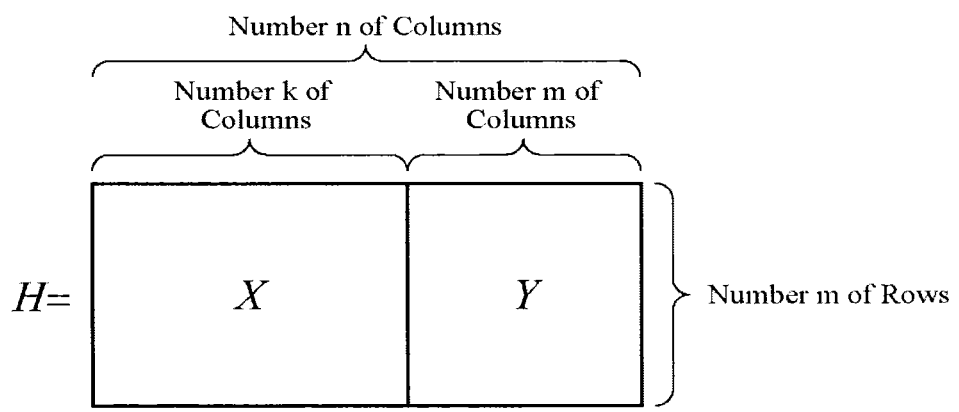
FIG. 2 is a view explaining the structure of a parity-check matrix for use in the error correction encoding device in accordance with Embodiment 1.

The parity-check matrix H is expressed as shown in equation (5) and FIG. 2. This parity-check matrix H includes an m×k matrix X corresponding to the information bit sequence d, and an m×m matrix Y corresponding to the parity bit sequence p, and the m×m matrix Y is a regular matrix. Then, the left side of the equation (4) can be deformed as shown in equation (6). From this equation (6) and the equation (4), the parity bit sequence p can be determined as shown in equation (7).

$$H = [XY] \qquad (5)$$

$$Hc^T = [XY](d_1, d_2, \ldots, d_k, p_1, p_2, \ldots, p_m)^T \qquad (6)$$
$$= Xd^T + Yp^T$$

$$Xd^T + Yp^T = 0 \qquad (7)$$
$$Yp^T = -Xd^T$$
$$p^T = Y^{-1}Xd^T$$

Figure 3:
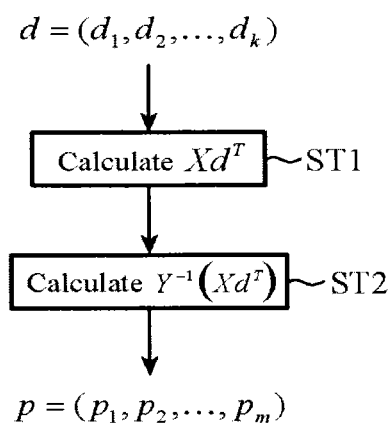
FIG. 3 is a flow chart showing the operation of the error correction encoding device in accordance with Embodiment 1.

On the basis of the above explanation, this Embodiment 1 will be explained. FIG. 3 is a flow chart showing the operation of the error correction encoding device 1 in accordance with this Embodiment 1.

In step ST11, the sparse matrix computing unit 2 computes exclusive OR of the information bit sequence d and the m×k matrix X in the parity-check matrix H to acquire a vector $Xd^T$ according to the above equation (6). In this case, because the m×k matrix X is a submatrix of the parity-check matrix H, the matrix X is sparse and the number of is few. Therefore, the number of times that exclusive OR is performed in this step ST11 is very small as compared with m×k.

In next step ST12, the matrix multiplier 4 multiplies the calculation result $Xd^T$ in step ST11 by an inverse matrix $Y^{-1}$ of the m×m matrix Y, which is calculated separately, to acquire a vector $Y^{-1}Xd^T$ according to the above equation (4). The inverse matrix $Y^{-1}$ is calculated in advance from the m×m matrix Y in the parity-check matrix H by the fundamental matrix operator 3. This inverse matrix $Y^{-1}$ is an m×m matrix, and is not necessarily a sparse matrix. Therefore, in this step ST12, it is necessary to calculate exclusive OR about m×m/2 times.

In this Embodiment 1, the number of times that exclusive OR is performed in step ST12 is dominant in the number of times of exclusive OR and is about m×m/2. On the other hand, because the number of times of exclusive OR is m×k/2 in the conventional method previously explained, the amount of computations in this Embodiment 1 is smaller than that in the conventional method at the time of m<k. Most LDPC codes used in an actual error correction encoding device satisfy m<k.

As mentioned above, the error correction encoding device 1 in accordance with Embodiment 1 performs the sparse matrix computing step of computing exclusive OR of a submatrix, in the parity-check matrix, corresponding to the information bit sequence, and the information bit sequence on the basis of the position of 1 in the submatrix to calculate a vector, and the matrix multiplying step of multiplying a predetermined matrix in which a predetermined fundamental matrix is performed on the submatrix, in the parity-check matrix, corresponding to the parity bit sequence (i.e., an inverse matrix $Y^{-1}$ of the submatrix, in the parity-check matrix, corresponding to the parity bit sequence) by the vector acquired in the sparse matrix computing step. Therefore, by performing the multiplication of the parity-check matrix and the information bit sequence while dividing the multiplication into two steps, the size of the inverse matrix which is used for the multiplication and is not sparse can be reduced to less than that in the conventional method. Therefore, the amount of computations for the encoding of an LDPC code can be reduced.

Because the computations in steps ST11 and ST12 of Embodiment 1 are an addition of bits and a multiplication of bits, respectively, a circuit that performs the addition by using an exclusive OR (EXOR) gate, and a circuit that performs the multiplication by using a logical product (AND) gate can be constructed as an example. More specifically, in the error correction encoding device 1, the sparse matrix computing unit 2 and the matrix multiplier 4 are constructed of the circuits that consist of the exclusive OR gate and the logical product gate, respectively.

In the case of this circuit structure, the number of times of exclusive OR can be reduced by reducing the size of the inverse matrix $Y^{-1}$ which is used for the multiplication and is not sparse to less than that in the conventional method, and, as a result, the circuit scale of the error correction encoding device 1 can also be reduced.

Further, although the error correction encoding method in the case in which a left portion of the vector of the codeword c is defined as the information bit sequence d, and a right portion of the vector is defined as the parity bit sequence p as shown in the equation (3) is explained in Embodiment 1, this embodiment is not limited to this example. For example, an arbitrary portion of the codeword c can be defined as the parity bit sequence p, and, in this case, in order to implement the structure in accordance with this Embodiment 1, there is provided, as an example, a method of performing a process of permuting the elements of the codeword c to place the parity bit sequence p in a right portion of the vector, and performing a process of also permuting the columns of the parity-check matrix H according to the former process. Because the essential characteristics of LDPC codes do not vary even if the columns of the parity-check matrix H are permuted, this method can be implemented.

In addition, although the error correction encoding device 1 in accordance with Embodiment 1 is constructed in such away as to include the fundamental matrix operator 3 and perform the fundamental matrix operation on the parity-check matrix for LDPC codes, the error correction encoding device can be constructed in such a way that a computation result of performing the fundamental matrix operation on the parity-check matrix is determined in advance, a storage, such as a memory, is made to hold the computation result as data, and the matrix multiplier 4 uses the data or the computation result is incorporated into the matrix multiplier 4 because this fundamental matrix operation is not dependent upon the information bit sequence and computations are carried out on the basis of only the parity-check matrix. In this case, the fundamental matrix operator 3 can be eliminated.

Embodiment 2

Figure 4:
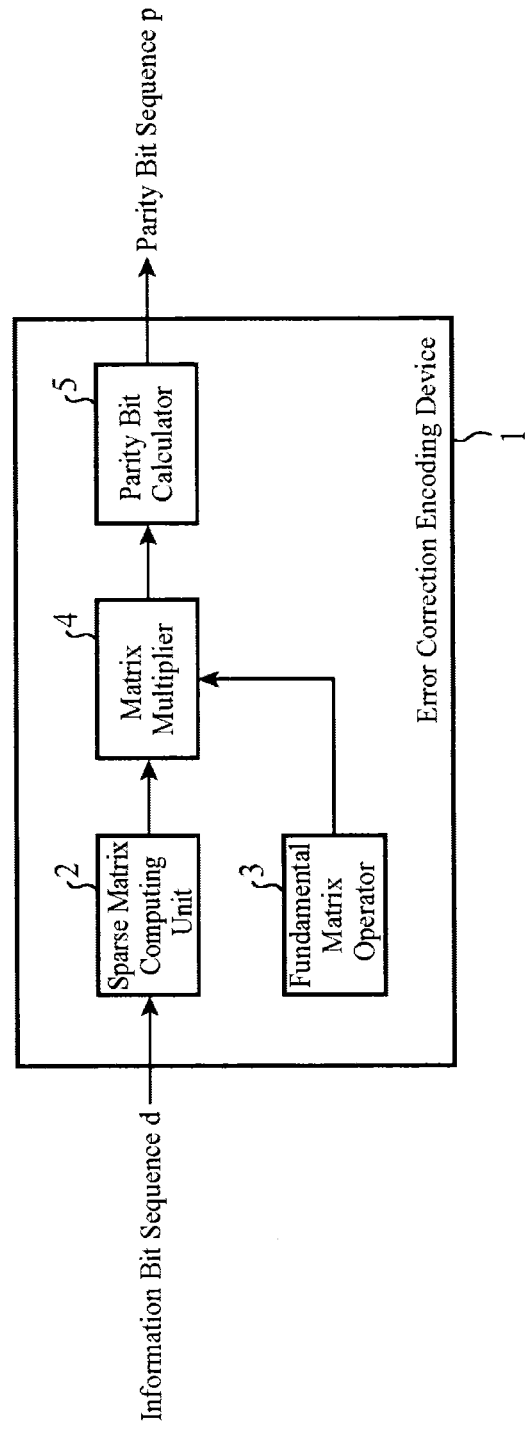
FIG. 4 is a block diagram showing the structure of an error correction encoding device in accordance with Embodiment 2 of the present invention.

FIG. 4 is a block diagram showing the structure of an error correction encoding device 1 in accordance with this Embodiment 2. The error correction encoding device 1 in accordance with this Embodiment 2 is provided with a sparse matrix computing unit 2, a fundamental matrix operator 3, a matrix multiplier 4, and a parity bit calculator 5. In FIG. 4, the same components as those shown in FIG. 1 or like components are designated by the same reference numerals, and the explanation of the components will be omitted hereafter.

Although the error correction encoding method in the case in which the above equation (4) is deformed into the above equation (7) is explained in above-mentioned Embodiment 1, an error correction encoding method in the case in which the above equation (4) is deformed into equation (8) shown below will be explained in Embodiment 2.

$$Xd^T + Yp^T = 0$$

$$Yp^T = -Xd^T$$

$$T_l p^T = SXd^T \tag{8}$$

A matrix $T_1$ in the equation (8) is an m×m matrix, and is a lower triangular matrix as shown in equation (9) shown below. More specifically, when the element at the i-th row and the j-th column of the matrix $T_1$ is expressed by $T_1(ij)$, the matrix $T_1$ satisfies equation (10) and equation (11).

As long as the matrix $T_1$ is an m×m matrix which satisfies the equations (9), (10), and (11), the matrix $T_1$ can be any type of matrix.

$$T_l = \begin{pmatrix} 1 & 0 & \cdots & 0 & 0 \\ & 1 & & 0 & 0 \\ & & \ddots & & \vdots \\ & & & 1 & 0 \\ & & & & 1 \end{pmatrix} \tag{9}$$

In the equation (9), the lower left half of the matrix $T_1$ is 0s or 1s.

$$T_1(ii)=1 \quad (1 \le i \le m) \tag{10}$$

$$T_1(ij)=0 \quad (1 \le i < j \le m) \tag{11}$$

In the equation (8), a matrix S is an m×m matrix and satisfies SY-$T_1$. When a fundamental matrix operation is performed on a predetermined matrix W=[YI](I is a unit matrix) in such a way that the portion of Y turns into $T_1$, this matrix W turns into [$T_1$S] and the right portion turns into S. More specifically, this matrix S is the one for converting the m×m matrix Y into the lower triangular matrix $T_1$.

This matrix S is calculated in advance by the fundamental matrix operator 3.

When the right-hand side (SXd$^T$) in the lowermost row of the equation (8) is expressed by a vector u, as shown in equation (12), the first element p1 of a parity bit sequence p can be calculated, as shown in equation (13). Further, the elements other than p1 can be calculated by using an operation which is called backward substitution, as shown in equation (14).

$$SXd^T = u^T = (u_1, u_2, \ldots, u_m)^T \tag{12}$$

$$p_1 = u_1 \tag{13}$$

$$p_i = u_i + \sum_{j=1}^{i} T_l(ij) p_{i-1} \quad (2 \le i \le m) \tag{14}$$

Figures 5, 6:
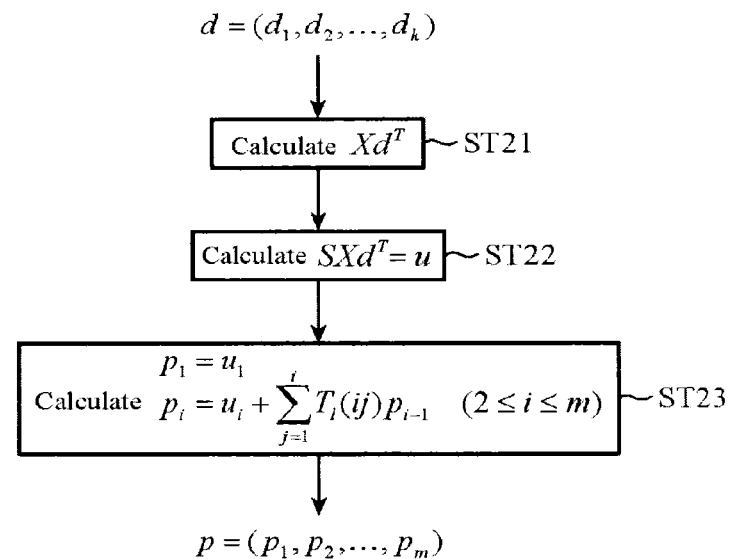
FIG. 5 is a flow chart showing the operation of the error correction encoding device in accordance with Embodiment 2.
FIG. 6 is a view showing an example of a QC-LDPC code used in Embodiment 3 of the present invention.

On the basis of the above explanation, this Embodiment 2 will be explained. FIG. 5 is a flow chart showing the operation of the error correction encoding device 1 in accordance with this Embodiment 2.

In step ST21, the sparse matrix computing unit 2 computes exclusive OR of an information bit sequence d and an m×k matrix X in a parity-check matrix H to acquire a vector Xd$^T$, like in the case of step ST11 of above-mentioned Embodiment 1.

In step ST22, the matrix multiplier 4 multiplies the calculation result Xd$^T$ in step ST21 by the matrix S calculated separately to acquire a vector u according to the above equation (12). The matrix S is an m×m matrix which is not sparse. Therefore, it is necessary to calculate exclusive OR about m×m/2 times in this step ST22.

In step ST23, the parity bit calculator 6 calculates the elements of the parity bit sequence p in turn from the vector u acquired in step ST22 according to the above equations (13) and (14). The amount of computations in this step ST23 is dependent upon the number of is included in the matrix $T_1$, and exclusive OR is performed about m×m/4 times.

According to the conventional method previously explained, the information bit sequence d is multiplied by the matrix Q1, and, after that, the parity bit sequence p is determined through calculations, like in the case of the equations (13) and (14). However, the matrix Q1 is an m×k matrix which is not sparse. Therefore, it is necessary to calculate exclusive OR about m×k/2 times, and the amount of computations is large.

In contrast, in accordance with this Embodiment 2, because the number of times of exclusive OR is, in step ST21, very smaller than m×m, is about m×m/2 in step ST22, and is about m×m/4 in step ST23, an LDPC code can be encoded through calculation of exclusive OR about 3×m×m/4 times in total. Therefore, when m<k, and the difference between m and k is large, the amount of computations can be reduced to less than about m×k/2 times in the conventional method.

Further, about 3×m×m/4 which is the value of the amount of computations estimated in this Embodiment 2 is greater than about m×m/2 in above-mentioned Embodiment 1. However, because the actual values of these amounts of computations are dependent upon the matrices S and $T_1$ and the inverse matrix Y$^{-1}$ in Embodiment 1, the concrete amount of computations differs according to the parity-check matrix H on which computations are performed. Further, the amount of computations in this Embodiment 2 becomes less than that in above-mentioned Embodiment 1 dependently upon the parity-check matrix H. Anyway, the amount of computations can be reduced to less than that in the conventional method.

As mentioned above, the error correction encoding device 1 in accordance with Embodiment 2 performs the sparse matrix computing step of computing exclusive OR of a submatrix, in the parity-check matrix, corresponding to the information bit sequence, and the information bit sequence on the basis of the position of 1 in the submatrix to calculate a vector, and the matrix multiplying step of multiplying a predetermined matrix in which a predetermined fundamental matrix is performed on the submatrix, in the parity-check matrix, corresponding to the parity bit sequence (i.e., a matrix S for converting the submatrix, in the parity-check matrix, corresponding to the parity bit sequence into a lower triangular matrix $T_1$) by the vector acquired in the sparse matrix computing step. Therefore, by performing the multiplication of the parity-check matrix and the information bit sequence while dividing the multiplication into two steps, the size of the matrix which is used for the multiplication and is not sparse can be reduced to less than that in the conventional method. Therefore, the amount of computations for the encoding of an LDPC code can be reduced.

Further, the error correction encoding device 1 in accordance with Embodiment 2 performs the parity bit calculating step of calculating the parity bit sequence by using both the vector acquired in the matrix multiplying step, and the lower triangular matrix. Therefore, the parity bit sequence can be calculated with a small number of times of an addition of a vector, and the amount of computations for the encoding of an LDPC code can be reduced.

Although the matrix $T_1$ is a lower triangular matrix in Embodiment 2, Embodiment 2 is not limited to this example. In that case, although whether step ST23 can be performed through an addition of a vector as shown in the equation (14) turns into a problem from the viewpoint of the amount of computations, the structure of the matrix $T_1$ which makes it possible to perform step ST23 through an addition of a vector is not limited to a lower triangular matrix. If step ST23 can be configured of a small number of times of an addition of a vector, an LDPC code can be encoded with a small amount of computations.

As an example of this matrix $T_1$, there is a matrix in which columns or rows of a lower triangular matrix are interchanged, or a matrix in which a part thereof is a lower triangle. Further, as a matter of course, if the matrix $T_1$ is a unit matrix, the matrix S is equivalent to an inverse matrix $Y^{-1}$ of the m×m matrix Y, and, more specifically, the same structure as that according to above-mentioned Embodiment 1 is provided.

Anyway, the fundamental matrix operator 3 can calculate the matrix S from the matrix $T_1$ in the same way as that using the calculating method of calculating the matrix S by performing the fundamental matrix operation explained above, so that step ST22 can be performed.

Further, because the computations in steps ST21 to ST23 of Embodiment 2 are an addition of bits and a multiplication of bits, respectively, the sparse matrix computing unit 2, the matrix multiplier 4, and the parity bit calculator 5 are constructed of circuits that consist of an exclusive OR gate and a logical product gate, respectively.

In the case of this circuit structure, the number of times of exclusive OR can be reduced by reducing the size of the matrix S which is used for the multiplication and is not sparse to less than that in the conventional method, and, as a result, the circuit scale of the error correction encoding device 1 can also be reduced.

Further, although the error correction encoding method in the case in which a left portion of the vector of the codeword c is defined as the information bit sequence d, and a right portion of the vector is defined as the parity bit sequence p is explained even in Embodiment 2, like in above-mentioned Embodiment 1, this embodiment is not limited to this example. For example, an arbitrary portion of the codeword c can be defined as the parity bit sequence p, and, in this case, in order to implement the structure in accordance with this Embodiment 2, there is provided, as an example, a method of performing a process of permuting the elements of the codeword c to place the parity bit sequence p in a right portion of the vector, and performing a process of also permuting the columns of the parity-check matrix H according to the former process. Because the essential characteristics of LDPC codes do not vary even if the columns of the parity-check matrix H are permuted, this method can be implemented.

In addition, even in Embodiment 2, the error correction encoding device can be constructed in such a way as that a computation result of performing the fundamental matrix operation on the parity-check matrix is determined in advance, a storage, such as a memory, is made to hold the computation result as data, and the matrix multiplier 4 uses the data or the computation result is incorporated into the matrix multiplier 4, thereby eliminating the fundamental matrix operator 3, like in above-mentioned Embodiment 1.

Embodiment 3

In this Embodiment 3, QC-LDPC codes are handled. A QC-LDPC code is a type of LDPC code, and is an LDPC code in which a parity-check matrix is constructed of blocks each of which is a circulant permutation matrix.

An example of a QC-LDPC code is shown in equation (15). In the equation (15), the number n of columns of the parity-check matrix H is set to n=Nq, and the number of rows of the matrix is set to m=Mq. More specifically, the parity-check matrix H has a structure of including M ($X_{ij}$, $Y_{ij}$) with respect to a vertical direction and N ($X_{ij}$, $Y_{ij}$) with respect to a horizontal direction. Further, the following relationship: K=N−M is established.

In addition, in the equation (15), the element $X_{ij}$ at the i-th row and the j-th column (1≤i≤M, 1≤j≤K) and the element $Y_{ij}$ at the i-th row and the j-th column (1≤i≤M, 1≤j≤M) are q×q square matrices, respectively, and each of them is a circulant permutation matrix or a zero matrix. A circulant permutation matrix is the one in which a unit matrix is cyclically shifted, as shown in equation (16).

$$H = [XY] \quad (15)$$

$$= \begin{pmatrix} X_{11} & X_{12} & \ldots & X_{1K} & Y_{11} & Y_{12} & \ldots & Y_{1M} \\ X_{21} & X_{22} & & X_{2K} & Y_{21} & Y_{22} & & Y_{2M} \\ \vdots & & \ddots & \vdots & \vdots & & \ddots & \vdots \\ X_{M1} & X_{M2} & \ldots & X_{MK} & Y_{M1} & Y_{M2} & \ldots & Y_{MM} \end{pmatrix}$$

$$X_{ij} = \begin{pmatrix} 0 & \ldots & 0 & 1 & 0 & \ldots & 0 \\ 0 & \ldots & 0 & 0 & 1 & \ldots & 0 \\ \vdots & & \vdots & & \vdots & \ddots & \\ 0 & 0 & 0 & 0 & 0 & 0 & 1 \\ 1 & 0 & 0 & 0 & 0 & 0 & 0 \\ & \ddots & & 0 & 0 & & \vdots \\ 0 & & 1 & 0 & 0 & \ldots & 0 \end{pmatrix} \quad (16)$$

Further, an example of a QC-LDPC code for use in this Embodiment 3 is shown in FIG. 6.

In the parity-check matrix H for QC-LDPC codes, the first column in blocks with M rows and M columns corresponding to a parity bit sequence p is $Z_j$.

Further, I which is shown as a submatrix in the parity-check matrix H is a q×q unit matrix. Further, 0 is a q×q zero matrix, and each of $X_{ij}$ and $Z_j$ is a circulant permutation matrix or a zero matrix.

In addition, in this Embodiment 3, an information bit sequence d is expressed as shown in equation (17), and the parity bit sequence p is expressed as shown in equation (18). In the notation of the equations (17) and (18), the information bit sequence d and the parity bit sequence p for use in above-mentioned Embodiments 1 and 2 are expressed for each block of the parity-check matrix H. More specifically, when the information bit sequence is divided into blocks each having q pieces of information data, $d_{b,i}$ is a vector which consists of q pieces of information data corresponding to the i-th block (1≤i≤K). Similarly, when the parity bit sequence is divided into blocks each having q parity bits, $p_{b,i}$ is a vector which consists of q parity bits corresponding to the i-th block (1≤i≤M).

$$d_{b,i} = (d_{(i-1)q+1}, d_{(i-1)q+2}, \ldots, d_{iq}) \quad (17)$$

$$p_{b,i} = (p_{(i-1)q+1}, p_{(i-1)q+2}, \ldots, p_{iq}) \quad (18)$$

Next, an encoding method of encoding an LDPC code in accordance with this Embodiment 3 will be explained by using equations.

First, equations regarding the parity-check matrix H, the information bit sequence d, and the parity bit sequence p are determined on the basis of the above equation (3), like in the case of above-mentioned Embodiments 1 and 2. At that time, when the notation separately provided for each block which is explained in the equations (15), (17), and (18) is used as the parity-check matrix H, the information bit sequence d, and the parity bit sequence p, the equation (3) turns into equation (19) shown below.

$$Hc^T = \begin{pmatrix} X_{11} & X_{12} & \ldots & X_{1K} & Z_1 & I & 0 & 0 & \ldots & 0 \\ X_{21} & X_{22} & & X_{2K} & Z_2 & I & I & 0 & & 0 \\ & & & & Z_3 & 0 & I & I & & 0 \\ \vdots & & \ddots & \vdots & Z_4 & & I & \ddots & & \\ & & & & \vdots & \vdots & & & \ddots & I \\ X_{M1} & X_{M2} & \ldots & X_{MK} & Z_M & 0 & 0 & 0 & 0 & I \end{pmatrix} \begin{pmatrix} d_{b,1} \\ \vdots \\ d_{b,K} \\ p_{b,1} \\ \vdots \\ p_{b,M} \end{pmatrix} \quad (19)$$

$$= \begin{pmatrix} 0 \\ \vdots \\ 0 \end{pmatrix}$$

When this equation (19) is divided into parts respectively corresponding to the blocks and expanded, equation (20) is acquired for the blocks in the first row, equation (21) is acquired for the blocks in the second through (M−1)-th rows, and equation (22) is acquired for the blocks in the M-th row. Summing up the equations (20), (22), and (21) with respect to j, equation (23) is acquired.

$$\sum_{i=1}^{K} X_{i1} d_{b,i}^T + Z_1 p_{b,1}^T + p_{b,2}^T = 0 \quad (20)$$

$$\sum_{i=1}^{K} X_{ij} d_{b,i}^T + Z_j p_{b,1}^T + p_{b,j}^T + p_{b,j+1}^T = 0 \ (2 \le j \le M - 1) \quad (21)$$

$$\sum_{i=1}^{K} X_{iM} d_{b,i}^T + Z_M p_{b,1}^T + p_{b,M}^T = 0 \quad (22)$$

$$\sum_{j=1}^{M} \left( \sum_{i=1}^{K} X_{ij} d_{b,i}^T \right) + \sum_{j=1}^{M} Z_j p_{b,1}^T = 0 \quad (23)$$

Because only the parity bit block $p_{b,1}$ is included in the equation (23), equation (24) can be acquired by deforming the equation (23) and $p_{b,1}$ can be calculated.

$$p_{b,1}^T = \left( \sum_{j=1}^{M} Z_j \right)^{-1} \left( \sum_{j=1}^{M} \left( \sum_{i=1}^{K} X_{ij} d_{b,i}^T \right) \right) \quad (24)$$

In addition, summing up the equations (21) and (22) with respect to some of j as appropriate, equation (25) with which $p_{b,j}$ for each j (2≤j≤M−1) can be calculated is acquired, and equation (26) can be acquired by deforming this equation (25). $p_{b,1}$ in the right-hand side of the equation (26) is a value calculated from the above equation (24). r shows targets (j, j+1, . . . , M) whose sum is calculated with Σ. By using the equation (26), the sum of vectors within sigma (within round brackets) is determined with respect to the j-th through M-th blocks.

$$\sum_{r=j}^{M} \left( \sum_{i=1}^{K} X_{ir} d_{b,i}^T \right) + \sum_{r=j}^{M} (Z_r p_{b,1}^T) + p_{b,j}^T = 0 \ (2 \le j \le M - 1) \quad (25)$$

$$p_{b,j}^T = \sum_{r=j}^{M} \left( \sum_{i=1}^{K} X_{ir} d_{b,i}^T \right) + \sum_{r=j}^{M} (Z_r p_{b,1}^T) \ (2 \le j \le M - 1) \quad (26)$$

Further, equation (27) with which $p_{b,M}$ can be calculated is acquired from the equation (22), and, also in the equation (27), $p_{b,M}$ can be calculated by using $p_{b,1}$ calculated from the equation (24), like in the equation (26).

$$p_{b,M}^T = \sum_{i=1}^{K} X_{iM} d_{b,i}^T + Z_M p_{b,1}^T \quad (27)$$

The parity bits for the LDPC code having the parity-check matrix H can be calculated and the LDPC code can be encoded in the above-mentioned way.

On the basis of the above explanation, this Embodiment 3 will be explained.

Figure 7:
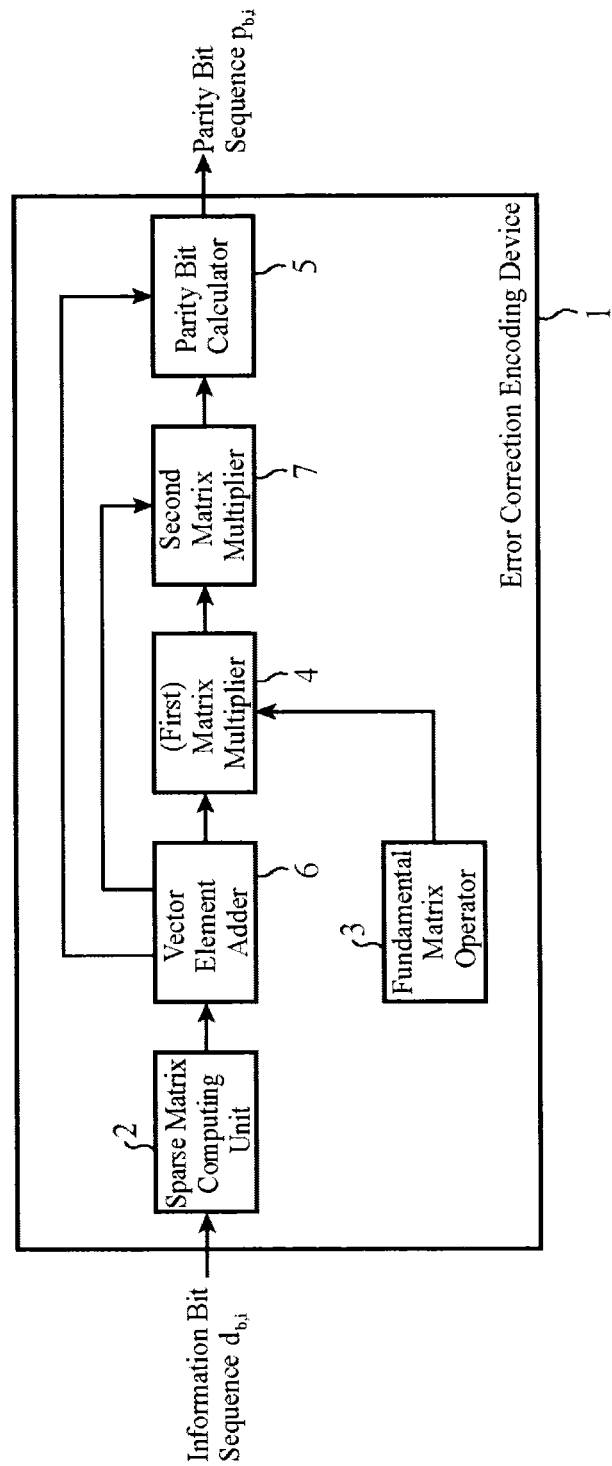
FIG. 7 is a block diagram showing the structure of an error correction encoding device in accordance with Embodiment 3.

FIG. 7 is a block diagram showing the structure of an error correction encoding device 1 in accordance with this Embodiment 3. The error correction encoding device 1 in accordance with this Embodiment 3 is provided with a sparse matrix computing unit 2, a fundamental matrix operator 3, a (first) matrix multiplier 4, a parity bit calculator 5, a vector element summer 6, and a second matrix multiplier 7. In FIG. 7, the same components as those shown in FIGS. 1 and 4 or like components are designated by the same reference numerals, and the explanation of the components will be omitted hereafter.

Figure 8:
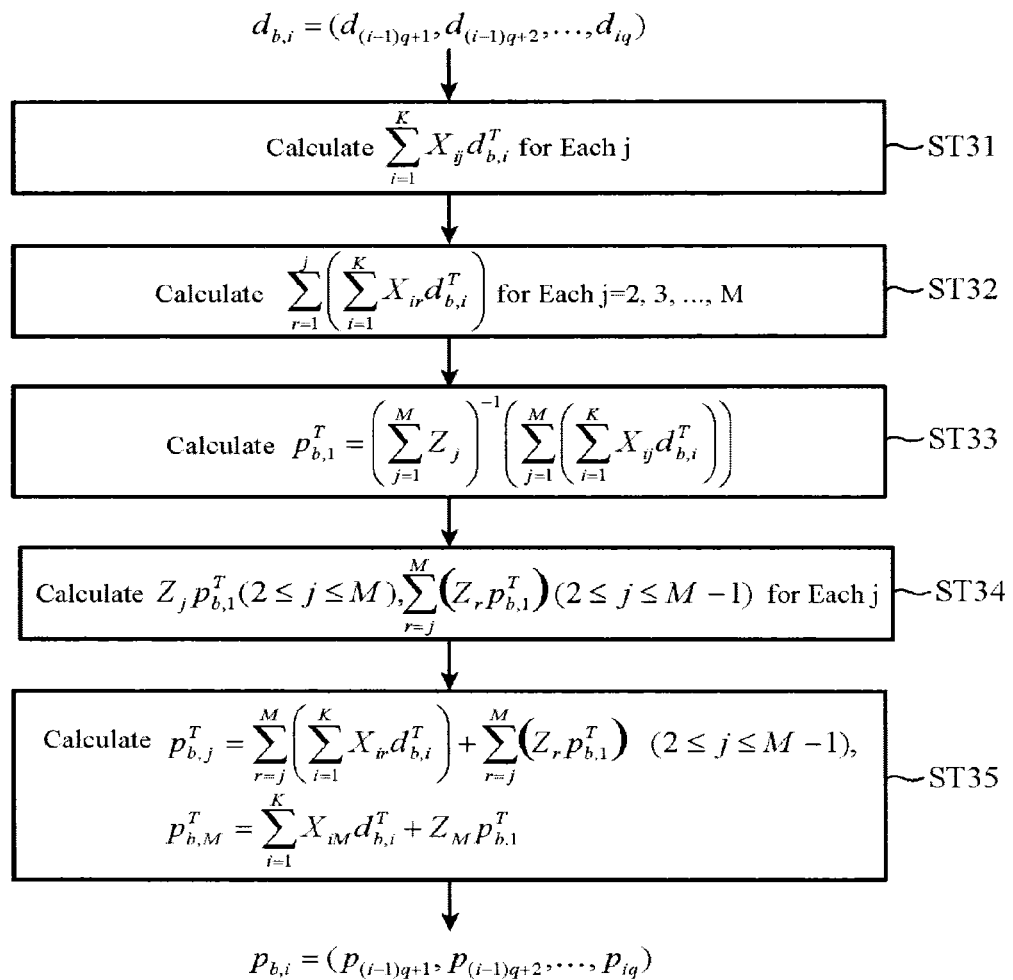
FIG. 8 is a flow chart showing the operation of the error correction encoding device in accordance with Embodiment 3.

FIG. 8 is a flow chart showing the operation of the error correction encoding device 1 in accordance with this Embodiment 3.

In step ST31, the sparse matrix computing unit 2 computes exclusive OR of the information bit sequence $d_{b,i}$ and the submatrix $X_{ij}$ in the parity-check matrix H to acquire a q-dimensional vector for each j of $X_{ij} d_{b,i}$, like in the case of steps ST11 and ST21 of above-mentioned Embodiments 1 and 2, though the notation differs between step ST31 and steps ST11 and ST21. This step ST31 corresponds to the calculation of the first terms of the above equations (20) to (22). Because $X_{ij}$ is a circulant permutation matrix and is a sparse matrix, the amount of computations in this step ST31 is small.

In step ST32, the vector element summer 6 sums up the q-dimensional vector which is the calculation result in step ST31 with respect to r=1 to j (M−1) times. This step ST32 corresponds to the calculation of the first term of the above equation (23).

In step ST33, the matrix multiplier 4 multiplies the calculation result in step ST32 by the inverse matrix of a matrix which is the sum of $Z_j$ with respect to j=1 to M, which is calculated separately, to acquire a parity bit sequence $p_{b,1}$ according to the above equation (24). In this case, the inverse matrix of the sum of $Z_j$ is calculated in advance by the fundamental matrix operator 3. Although this inverse matrix is not sparse, the inverse matrix is a q×q matrix and its matrix size is small. Therefore, the amount of computations in this step ST33 is small.

In step ST34, the second matrix multiplier 7 multiplies the parity bit sequence $p_{b,1}$, which is acquired in step ST33, by each $Z_j$ and calculates the sum of vectors which are the results of the multiplication. This step ST34 corresponds to the calculation of the second term of the above equation (25). $Z_j$ is sparse and the amount of computations is small.

In step ST35, the parity bit calculator 5 adds the calculation result in step ST32 and the calculation result in step ST34 to calculate parity bit sequences $p_{b,j}$ and $p_{b,M}$ according to the above equations (26) and (27). Because this step ST35 is the addition of two vectors, the amount of computations is small.

In this Embodiment 3, the amount of computations is reduced by reducing the computations using the matrix which is not sparse. Although the matrix which is not sparse is the inverse matrix of the sum of $Z_j$ with respect to j in step ST33, this inverse matrix is a q×q matrix and its size is small. As a guideline, compared with m and k of the size of a matrix which is not sparse and which is used in above-mentioned Embodiments 1 and 2 and the conventional method, q is typically as small as ⅓ to ¹/₁₀₀. Therefore, the amount of computations in step ST33 results from the calculation of exclusive OR about q×q/2 times, and the amount of computations can be reduced by order of the square of q/m or q/k as compared with that in the conventional method.

Although the step in which the amount of computations is the largest, among the steps other than step ST33, is step ST31, the matrix X used in step ST31 is sparse and the computation done in step ST31 is the same as those in steps ST11 and ST21 of above-mentioned Embodiments 1 and 2. Therefore, if the same parity-check matrix is provided, the encoding method according to this Embodiment 3 makes it possible to reduce the amount of computations as compared with the encoding method according to any one of above-mentioned Embodiments 1 and 2.

As mentioned above, the error correction encoding device 1 in accordance with Embodiment 3 is constructed in such a way as to perform the sparse matrix computing step of computing exclusive OR of submatrices, in the parity-check matrix, corresponding to the information bit sequence, and the information bit sequence on the basis of the position of 1 in each of the submatrices to calculate a plurality of vectors; the vector element summing step of acquiring a vector which is the sum of the plurality of vectors acquired in the sparse matrix computing step; the (first) matrix multiplying step of multiplying the inverse matrix of a matrix which is acquired by summing up a part of submatrices, in the parity-check matrix, corresponding to the parity bit sequence and the sum vector acquired in the vector element summing step to calculate a part of the parity bit sequence; the second matrix multiplying step of multiplying the part of the submatrices which is the target for the summation in the (first) matrix multiplying step and the part of the parity bit sequence acquired in the (first) matrix multiplying step to acquire a vector which is a multiplication result; and the parity bit calculating step of calculating a remaining part of the parity bit sequence on the basis of the plurality of vectors acquired in the sparse matrix computing step and the vector which is the multiplication result acquired in the second matrix multiplying step. Therefore, in the encoding of a QC-LDPC code, many of the computations can be performed by using sparse matrices, and the amount of computations can be reduced. Further, the size of the inverse matrix which is used for the multiplication and which is not sparse can be reduced to less than that in the conventional method, like in the case of above-mentioned Embodiments 1 and 2, and this reduction can also result in a reduction in the amount of computations.

Further, because the computations in steps ST31 to ST35 of Embodiment 3 are an addition of bits and a multiplication of bits, respectively, the sparse matrix computing unit 2, the matrix multiplier 4, the second matrix multiplier 7, and the parity bit calculator 5 are constructed of circuits that consist of an exclusive OR gate and a logical product gate, respectively.

In the case of this circuit structure, the number of times of exclusive OR can be reduced by reducing the size of the inverse matrix which is used for the multiplication and is not sparse to less than that in the conventional method, and, as a result, the circuit scale of the error correction encoding device 1 can also be reduced.

Further, although the error correction encoding method in the case in which a left portion of the vector of the codeword c is defined as the information bit sequence d, and a right portion of the vector is defined as the parity bit sequence p is explained even in Embodiment 3, like in above-mentioned Embodiments 1 and 2, this embodiment is not limited to this example. For example, an arbitrary portion of the codeword c can be defined as the parity bit sequence p, and, in this case, in order to implement the structure in accordance with this Embodiment 3, there is provided, as an example, an method of performing a process of permuting the elements of the codeword c to place the parity bit sequence p in a right portion of the vector, and performing a process of also permuting the columns of the parity-check matrix H according to the former process. Because the essential characteristics of LDPC codes do not vary even if the columns of the parity-check matrix H are permuted, this method can be implemented.

In addition, even in Embodiment 3, the error correction encoding device can be constructed in such a way as that a computation result of performing a fundamental matrix operation on the parity-check matrix is determined in advance, a storage, such as a memory, is made to hold the computation result as data, and the matrix multiplier 4 uses the data or the computation result is incorporated into the matrix multiplier 4, thereby eliminating the fundamental matrix operator 3, like in above-mentioned Embodiments 1 and 2.

Embodiment 4

Figure 9:
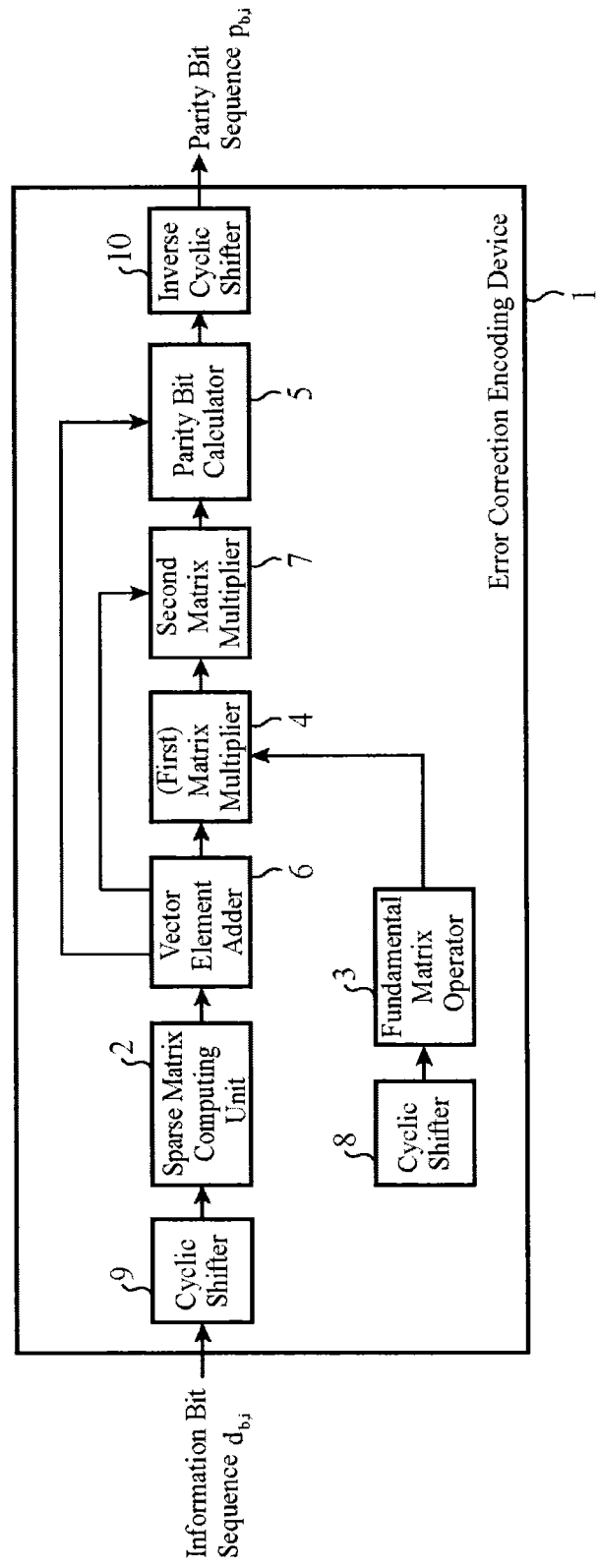
FIG. 9 is a block diagram showing the structure of an error correction encoding device in accordance with Embodiment 4 of the present invention.

FIG. 9 is a block diagram showing the structure of an error correction encoding device 1 in accordance with Embodiment 4 of the present invention. The error correction encoding device 1 in accordance with this Embodiment 4 is provided with a sparse matrix computing unit 2, a fundamental matrix operator 3, a matrix multiplier 4, a parity bit calculator 5, a vector element summer 6, a second matrix multiplier 7, cyclic shifters 8 and 9, and an inverse cyclic shifter 10. In FIG. 9, the same components as those shown in FIG. 7 or like components are designated by the same reference numerals, and the explanation of the components will be omitted hereafter.

In this Embodiment 4, an arithmetic expression for a parity bit sequence p explained in above-mentioned Embodiment 3 will be explained by using another representation based on a fundamental matrix operation. As already explained, an example of a parity-check matrix H for QC-LDPC codes to which above-mentioned Embodiment 3 is applied is as shown in FIG. 6. The parity-check matrix H shown in FIG. 6 has a simple structure because of the predetermined fundamental matrix operation which the fundamental matrix operator 3 performs. FIG. 10 is a view explaining the fundamental matrix operation. When additions (1) to (M−1) are carried out on the parity-check matrix H in turn on a per block basis, as shown in a portion above a central arrow, a matrix shown in a portion below the arrow is acquired. It can be seen that through this fundamental matrix operation, many unit matrices Is can be erased, and the parity-check matrix has a structure of a lower triangular matrix, except for the sum of $Z_r$ appearing in the first row with respect to r=1 to M. This sum of $Z_r$ corresponds to a q×q matrix which is used as the inverse matrix in step ST33 of FIG. 8 and in the above equation (24), and which is the sum of $Z_j$.

On the basis on the above explanation, it is clear that the structure of the parity-check matrix H is not limited to the structure shown in FIG. 6.

Therefore, in this Embodiment 4, the parity-check matrix H shown in FIG. 11 is used as an example. The parity-check matrix H shown in FIG. 11 has a structure in which some or all of the unit matrices I in the parity-check matrix H shown in FIG. 6 are replaced by circulant permutation matrices $A_j$. Further, some or all of the circulant permutation matrices $A_j$ are replaced by zero matrices.

More specifically, in each addition (j) (1≤j≤M−1) shown in FIG. 10, instead of the fundamental matrix operator 3 simply performing the addition on a per block basis, in the case of FIG. 11, the cyclic shifter 8 performs cyclic shift on a block $X_{ij}$, $Z_j$, or $A_j$ which is a lower one of the two blocks to be added (e.g., a block in the M-th row which is the lowermost row of the parity-check matrix H and a block in the (M−1)-th row which is higher than the M-th row by one row) first, and the fundamental matrix operator 3 then adds the lower block on which the cyclic shift is performed to the upper block. By repeating this process, a matrix which is the same as the matrix shown in the portion below the arrow in FIG. 10 is acquired.

The matrix acquired in this case has a structure in which cyclic shift is performed on some submatrices $X_{ij}$ and $Z_j$ in the matrix shown in the portion below the arrow in FIG. 10. Is and 0s shown in FIG. 10 still remain the same as those in FIG. 10.

After summing up (j) the rows of the parity-check matrix H in which cyclic shift is performed on $X_{ij}$, $Z_j$, and $A_j$ by the cyclic shifter 8, the fundamental matrix operator 3 calculates the inverse matrix of the sum of $Z_r$ appearing in the first row with respect to r=1 to M and outputs this inverse matrix to the matrix multiplier 4.

Although a matrix which is the same as the matrix shown in the portion below the arrow in FIG. 10 can be acquired by performing cyclic shift on the submatrices in the parity-check matrix H and then performing the fundamental matrix operation, as mentioned above, it is necessary to, according to the cyclic shift at this time, also perform cyclic shift on an information bit sequence d and a parity bit sequence p.

Concretely, the cyclic shifter 9 performs cyclic shift on each partial vector $d_{b,i}$ of the information bit sequence d before performing step ST31 of FIG. 8. The inverse cyclic shifter 10 on another side performs cyclic shift on each partial vector $p_{b,i}$ of the parity bit sequence p after performing step ST35 of FIG. 8. The cyclic shift which the cyclic shifter 9 and the inverse cyclic shifter 10 perform corresponds to the cyclic shift on the blocks $X_{ij}$, $Z_j$, and $A_j$ which the cyclic shifter 8 performs, and the cyclic shifter 9 performs cyclic shift which is the same as that on each $X_{ij}$ in the parity-check matrix H which the cyclic shifter 8 performs on the information bit sequence $d_{b,i}$ to shift this information bit sequence. Further, the inverse cyclic shifter 10 performs shift inverse to the cyclic shift which the cyclic shifter 8 performs on each $Z_j$ and each $A_j$ in the parity-check matrix H on the parity bit sequence $p_{b,i}$ to return this parity bit sequence to its original state.

The error correction encoding device 1 in accordance with this Embodiment 4 can also implement an encoding method which is the same as that shown in FIG. 8 by performing the above-mentioned processing.

As mentioned above, the error correction encoding device 1 in accordance with Embodiment 4 uses, as the parity-check matrix, a matrix which consists of submatrices $X_{ij}$ (i shows a row and j shows a column) corresponding to the information bit sequence, submatrices $Z_j$ in the first column of the submatrix corresponding to the parity bit sequence, and submatrices in the second and subsequent columns, and the submatrices in the second and subsequent columns have a structure of including circulant permutation matrices $A_j$ as diagonal elements and also including unit matrices respectively located under the above-mentioned circulant permutation matrices $A_j$, and in which some of the submatrices $X_{ij}$ and $Z_j$ and the circulant permutation matrices $A_j$ are cyclically shifted by the cyclic shifter 8. Therefore, an LDPC code can be encoded by using the encoding method shown in FIG. 8 by performing cyclic shift on some submatrices in the parity-check matrix H having the structure shown in FIG. 11. Because the number of Is included in the matrix does not change even if cyclic shift is performed on some submatrices, the amount of computations becomes the same as that in the case of the parity-check matrix H having a structure shown in FIG. 6 in accordance with above-mentioned Embodiment 3. Therefore, as compared with those in the conventional method and the encoding method in accordance with above-mentioned Embodiments 1 and 2, the amount of computations can be reduced.

Figures 12, 13:
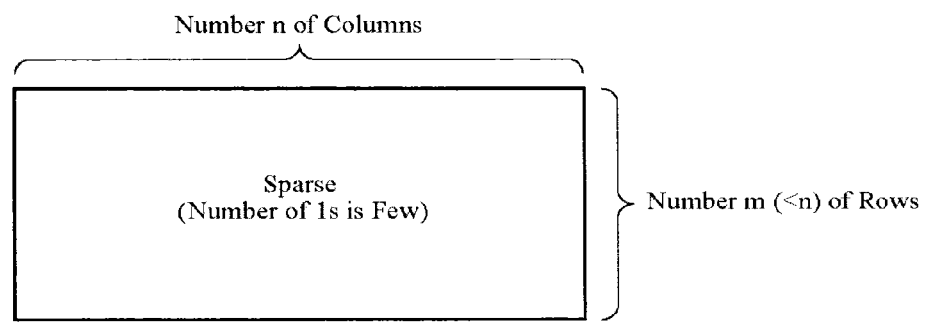
FIG. 12 is a view showing another example of the QC-LDPC code used in Embodiment 4.
FIG. 13 is a view explaining the structure of a parity-check matrix for LDPC codes.
Figure 14:
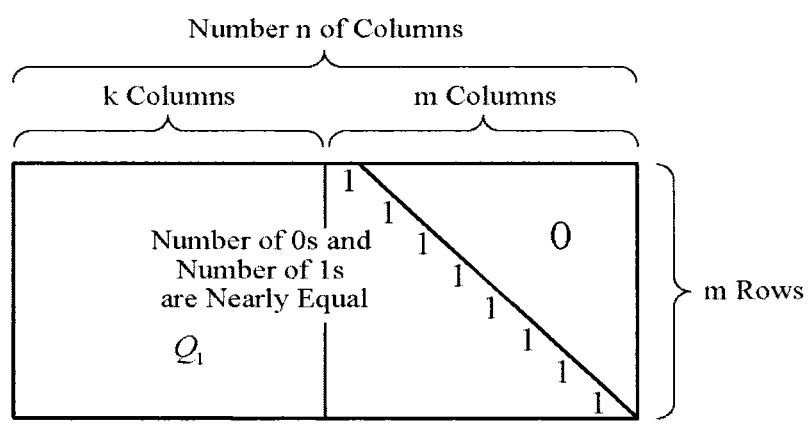
FIG. 14 is a view explaining an example of the structure of a parity-check matrix for use in a conventional encoding method.
Figure 15:
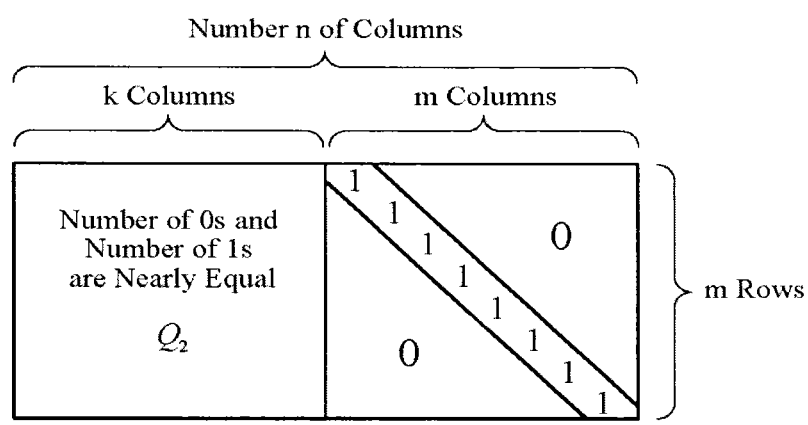
FIG. 15 is a view explaining another example of the structure of the parity-check matrix for use in the conventional encoding method.

In addition, the parity-check matrix H applicable to this Embodiment 4 is not limited to the example shown in FIG. 11. For example, as shown in FIG. 12, some or all of the unit matrices I in the parity-check matrix H shown in FIG. 11 can be replaced by circulant permutation matrices $B_j$. Further, some or all of the circulant permutation matrices $B_j$ can be replaced by zero matrices. This is because even if the rows of the parity-check matrix H are interchanged, the essential structure of the parity-check matrix and LDPC codes does not change. As a matter of course, even if cyclic shift is performed on rows on a per block basis, the essential structure does not change. When each circulant permutation matrix $B_j$ is replaced by a unit matrix I on a per block basis in the rows of the parity-check matrix H shown in FIG. 12, the parity-check matrix H has the same structure as that shown in FIG. 11.

Also in the case of FIG. 12, the cyclic shifter 8 performs cyclic shift on a block $X_{ij}$, $Z_j$, $A_j$, or $B_j$ which is a lower one of the two blocks to be added first, and the fundamental matrix operator 3 then adds the lower block on which the cyclic shift is performed to the upper block. By repeating this process, a matrix which is the same as the matrix shown in the portion below the arrow in FIG. 10 is acquired.

The matrix acquired in this case has a structure in which cyclic shift is performed on some submatrices $X_{ij}$, $Z_j$, and I replaced by $A_j$ in the matrix shown in the portion below the arrow in FIG. 10. After summing up (j) the rows of the parity-check matrix H in which cyclic shift is performed on $X_{ij}$, $Z_j$, $A_j$, and $B_j$ by the cyclic shifter 8, the fundamental matrix operator 3 calculates the inverse matrix of the sum of $Z_r$, appearing in the first row with respect to r=1 to M and outputs this inverse matrix to the matrix multiplier 4.

Also in this case, the cyclic shifter 9 performs cyclic shift on each partial vector $d_{b,i}$ of the information bit sequence d, like the cyclic shifter 8, and the inverse cyclic shifter 10 performs cyclic shift inverse to that by the cyclic shifter 8 on each partial vector $p_{b,i}$ of the parity bit sequence p.

The error correction encoding device can also implement an encoding method which is the same as that shown in FIG. 8 by performing the above-mentioned processing.

As mentioned above, the error correction encoding device 1 in accordance with Embodiment 4 uses, as the parity-check matrix, a matrix which consists of submatrices $X_{ij}$ (i shows a row and j shows a column) corresponding to the information bit sequence, submatrices $Z_j$ in the first column of the submatrix corresponding to the parity bit sequence, and submatrices in the second and subsequent columns, and the submatrices in the second and subsequent columns have a structure of including circulant permutation matrices $A_j$ as diagonal elements and also including circulant permutation matrices $B_j$ respectively located under the above-mentioned circulant permutation matrices $A_j$, and in which some of the submatrices $X_{ij}$ and $Z_j$ and the circulant permutation matrices $A_j$ and $B_j$ are cyclically shifted by the cyclic shifter 8. Therefore, an LDPC code can be encoded by using the encoding method shown in FIG. 8 by performing cyclic shift on some submatrices in the parity-check matrix H having the structure shown in FIG. 12. Because the number of 1s included in the matrix does not change even if cyclic shift is performed on some submatrices, the amount of computations becomes the same as that in the case of the parity-check matrix H having a structure shown in FIG. 6 in accordance with above-mentioned Embodiment 3. Therefore, as compared with those in the conventional method and the encoding method in accordance with above-mentioned Embodiments 1 and 2, the amount of computations can be reduced.

Further, because even in Embodiment 4 the computations in steps ST31 to ST35 shown in FIG. 8 are an addition of bits and a multiplication of bits, respectively, like in above-mentioned Embodiment 3, the sparse matrix computing unit 2, the matrix multiplier 4, the second matrix multiplier 7, and the parity bit calculator 5 are constructed of circuits that consist of an exclusive OR gate and a logical product gate, respectively. In the case of this circuit structure, the number of times of exclusive OR can be reduced by reducing the size of the inverse matrix which is used for the multiplication and is not sparse to less than that in the conventional method, and, as a result, the circuit scale of the error correction encoding device 1 can also be reduced.

Further, although the error correction encoding method in the case in which a left portion of the vector of the codeword c is defined as the information bit sequence d, and a right portion of the vector is defined as the parity bit sequence p is explained even in Embodiment 4, like in above-mentioned Embodiments 1 to 3, this embodiment is not limited to this example. For example, an arbitrary portion of the codeword c can be defined as the parity bit sequence p, and, in this case, in order to implement the structure in accordance with this Embodiment 4, there is provided, as an example, a method of performing a process of permuting the elements of the codeword c on a per block basis to place the parity bit sequence p in a right portion of the vector, and performing a process of also permuting the block columns of the parity-check matrix H according to the former process. If the parity-check matrix H after permutation has a structure as illustrated in FIGS. 11 and 12, Embodiment 4 can be implemented. More specifically, by permuting the rows and the columns on a per block basis, it can be said that Embodiment 4 can be implemented if the parity-check matrix H has a structure which can implement Embodiment 4 explained above.

In addition, even in Embodiment 4, the error correction encoding device can be constructed in such a way as that a computation result of performing the fundamental matrix operation on the parity-check matrix is determined in advance, a storage, such as a memory, is made to hold the computation result as data, and the matrix multiplier 4 uses the data or the computation result is incorporated into the matrix multiplier 4, thereby eliminating the fundamental matrix operator 3, like in above-mentioned Embodiments 1 to 3.

Further, because the cyclic shift is a process of changing the order of data in Embodiment 4, a computation result of performing cyclic shift or the fundamental matrix operation on the parity-check matrix can be determined in advance when rules governing the cyclic shift (output results of the cyclic shifter 8) has become known in advance, and, in that case, the cyclic shifter 8 and the fundamental matrix operator 3 can be omitted.

In addition, when the rules governing the cyclic shift has become known in advance, the error correction encoding device can be implemented without having to provide computing elements or the like which construct the cyclic shifter 9 and the inverse cyclic shifter 10. Because the order of data is determined from a method of connecting wires particularly in a case in which the error correction encoding device is implemented by circuits, the error correction encoding device can be implemented without having to provide computing elements, and the functions of the cyclic shifter 9 and the inverse cyclic shifter 10 can be implemented without increasing the circuit scale.

While the invention has been described in its preferred embodiments, it is to be understood that an arbitrary combination of two or more of the above-mentioned embodiments can be made, various changes can be made in an arbitrary component in accordance with any one of the above-mentioned embodiments, and an arbitrary component in accordance with any one of the above-mentioned embodiments can be omitted within the scope of the invention.

INDUSTRIAL APPLICABILITY

As mentioned above, the error correction encoding device in accordance with the present invention is suitable for use in a transmitter of a communication system or the like which encodes information data according to LDPC codes.

EXPLANATIONS OF REFERENCE NUMERALS

1 error correction encoding device, 2 sparse matrix computing unit, 3 fundamental matrix operator, 4 (first) matrix multiplier, 5 parity bit calculator, 6 vector element summer, 7 second matrix multiplier, 8 and 9 cyclic shifter, 10 inverse cyclic shifter.

The invention claimed is:

1. An error correction encoding method of calculating a parity bit sequence from an information bit sequence by using a sparse parity-check matrix for QC (Quasi-Cyclic)-LDPC (Low-Density Parity-Check) codes, and encoding the parity bit sequence, said error correction method comprising:
a sparse matrix computing step of computing exclusive OR of submatrices, in said sparse parity-check matrix, corresponding to said information bit sequence on a basis of a position of 1 in each of said submatrices to calculate a plurality of vectors;
a vector element summing step of acquiring a vector which is a sum of said plurality of vectors acquired in said sparse matrix computing step;
a first matrix multiplying step of multiplying an inverse matrix of a matrix which is acquired by summing up a part of submatrices, in said parity-check matrix, corresponding to said parity bit sequence and said sum vector acquired in said vector element summing step to calculate a part of said parity bit sequence;
a second matrix multiplying step of multiplying said part of the submatrices which is the target for the summation in said first matrix multiplying step and the part of said parity bit sequence acquired in said first matrix multiplying step to acquire a vector which is a multiplication result; and
a parity bit calculating step of calculating a remaining part of said parity bit sequence on a basis of said plurality of vectors acquired in said sparse matrix computing step and said vector which is the multiplication result acquired in said second matrix multiplying step.

2. The error correction encoding method according to claim 1, wherein said parity-check matrix consists of submatrices $X_{ij}$ (i shows a row and j shows a column) corresponding to said information bit sequence, submatrices $Z_j$ in a first column of a submatrix corresponding to said parity bit sequence, and submatrices in second and subsequent columns of the submatrix corresponding to said parity bit sequence, said submatrices in the second and subsequent columns have a structure of including circulant permutation matrices $A_j$ as diagonal elements and also including unit matrices respectively located under said circulant permutation matrices $A_j$, and some of said submatrices $X_{ij}$ and $Z_j$ and said circulant permutation matrices $A_j$ are cyclically shifted.

3. The error correction encoding method according to claim 1, wherein said parity-check matrix consists of submatrices $X_{ij}$ (i shows a row and j shows a column) corresponding to said information bit sequence, submatrices $Z_j$ in a first column of a submatrix corresponding to said parity bit sequence, and submatrices in second and subsequent columns of the submatrix corresponding to said parity bit sequence, said submatrices in the second and subsequent columns have a structure of including circulant permutation matrices $A_j$ as diagonal elements and also including circulant permutation matrices $B_j$ respectively located under said circulant permutation matrices $A_j$, and some of said submatrices $X_{ij}$ and $Z_j$ and said circulant permutation matrices $A_j$ and $B_j$ are cyclically shifted.

4. An error correction encoding method of calculating a parity bit sequence from an information bit sequence by using a sparse parity-check matrix for QC (Quasi-Cyclic)-LDPC (Low-Density Parity-Check) codes, and encoding the parity bit sequence, in which
said information bit sequence $d_{b,i}$ is a vector consisting of q elements corresponding an i-th block ($1 \le i \le K$) when elements thereof are divided into blocks each having q elements,
said parity bit sequence $p_{b,i}$ is a vector consisting of q elements corresponding an i-th block ($1 \le i \le M$) when elements thereof are divided into blocks each having q elements,
said parity-check matrix with M rows and N columns consists of submatrices $X_{ij}$ with M rows and K columns (K=N−M) corresponding to said information bit sequence, submatrices $Z_j$ in a first column of M rows and M columns corresponding to said parity bit sequence, and submatrices including unit matrices as diagonal elements of two rows, and
each element of said parity bit sequence is calculated according to three equations shown below:

$$p_{b,1}^T = \left(\sum_{j=1}^{M} Z_j\right)^{-1} \left(\sum_{j=1}^{M}\left(\sum_{i=1}^{K} X_{ij} d_{b,i}^T\right)\right)$$

$$p_{b,j}^T = \sum_{r=j}^{M}\left(\sum_{i=1}^{K} X_{ir} d_{b,i}^T\right) + \sum_{r=j}^{M}(Z_r p_{b,1}^T) \quad (2 \le j \le M-1)$$

$$p_{b,M}^T = \sum_{i=1}^{K} X_{iM} d_{b,i}^T + Z_M p_{b,1}^T$$

where T is a transposed matrix.

5. The error correction encoding method according to claim 4, wherein said parity-check matrix consists of the submatrices $X_{ij}$ (i shows a row and j shows a column) corresponding to said information bit sequence, the submatrices $Z_j$ in the first column of the submatrix corresponding to said parity bit sequence, and the submatrices in the second and subsequent columns of the submatrix corresponding to said parity bit sequence, said submatrices in the second and subsequent columns have a structure of including circulant permutation matrices $A_j$ as diagonal elements and also including unit matrices respectively located under said circulant permutation matrices $A_j$, and some of said submatrices $X_{ij}$ and $Z_j$ and said circulant permutation matrices $A_j$ are cyclically shifted.

6. The error correction encoding method according to claim 4, wherein said parity-check matrix consists of the submatrices $X_{ij}$ (i shows a row and j shows a column) corresponding to said information bit sequence, the submatrices $Z_j$ in the first column of the submatrix corresponding to said parity bit sequence, and the submatrices in the second and subsequent columns of the submatrix corresponding to said parity bit sequence, said submatrices in the second and subsequent columns have a structure of including circulant permutation matrices $A_j$ as diagonal elements and also including circulant permutation matrices $B_j$ respectively located under said circulant permutation matrices $A_j$, and some of said submatrices $X_{ij}$ and $Z_j$ and said circulant permutation matrices $A_j$ and $B_j$ are cyclically shifted.

7. An error correction encoding device that calculates a parity bit sequence from an information bit sequence by using a sparse parity-check matrix for QC (Quasi-Cyclic)-LDPC (Low-Density Parity-Check) codes, and encodes the parity bit sequence, said device comprising:
- a sparse matrix computing unit that computes exclusive OR of submatrices, in said sparse parity-check matrix, corresponding to said information bit sequence, and said information bit sequence on a basis of a position of 1 in each of said submatrices to calculate a plurality of vectors;
- a vector element summer that acquires a vector which is a sum of said plurality of vectors acquired by said sparse matrix computing unit;
- a first matrix multiplier that multiplies an inverse matrix of a matrix which is acquired by summing up a part of submatrices, in said parity-check matrix, corresponding to said parity bit sequence and said sum vector acquired by said vector element summer to calculate a part of said parity bit sequence;
- a second matrix multiplier that multiplies said part of the submatrices which is the target for the summation by said first matrix multiplier and the part of said parity bit sequence acquired by said first matrix multiplier to acquire a vector which is a multiplication result; and
- a parity bit calculator that calculates a remaining part of said parity bit sequence on a basis of said plurality of vectors acquired by said sparse matrix computing unit and said vector which is the multiplication result acquired by said second matrix multiplier.

* * * * *